(12) United States Patent
Oh et al.

(10) Patent No.: US 10,340,947 B2
(45) Date of Patent: Jul. 2, 2019

(54) METHODS OF CONTROLLING RECLAIM OF NONVOLATILE MEMORY DEVICES, METHODS OF OPERATING STORAGE DEVICES, AND STORAGE DEVICES

(71) Applicant: Samsung Electronics Co., Ltd., Gyeonggi-do (KR)

(72) Inventors: Shin-Ho Oh, Yongin-si (KR); Woo-Hyun Kang, Suwon-si (KR); Min-Kyu Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 46 days.

(21) Appl. No.: 15/494,507

(22) Filed: Apr. 23, 2017

(65) Prior Publication Data

US 2018/0102790 A1    Apr. 12, 2018

(30) Foreign Application Priority Data

Oct. 12, 2016    (KR) .......................... 10-2016-0131977

(51) Int. Cl.
| | |
|---|---|
| G11C 16/26 | (2006.01) |
| G11C 29/52 | (2006.01) |
| H03M 13/00 | (2006.01) |
| H03M 13/05 | (2006.01) |
| G11C 29/00 | (2006.01) |

(52) U.S. Cl.
CPC ............. *H03M 13/05* (2013.01); *G11C 16/26* (2013.01); *G11C 29/52* (2013.01); *H03M 13/611* (2013.01)

(58) Field of Classification Search
CPC ...... G11C 16/26; G11C 29/52; H03M 13/611; H03M 13/05
See application file for complete search history.

(56) References Cited

U.S. PATENT DOCUMENTS

| | | |
|---|---|---|
| 8,356,152 B2 | 1/2013 | You |
| 8,689,082 B2 | 4/2014 | Oh et al. |
| 9,348,746 B2 | 5/2016 | Sinclair et al. |
| 9,431,122 B2 | 8/2016 | Lee |
| 2010/0208521 A1* | 8/2010 | Kim ...................... G11C 16/26 365/185.09 |
| 2010/0235713 A1 | 9/2010 | Lee et al. |

(Continued)

FOREIGN PATENT DOCUMENTS

| | | |
|---|---|---|
| KR | 10-2013-0013574 A | 2/2013 |
| KR | 10-2016-0037349 A | 4/2016 |

*Primary Examiner* — Guy J Lamarre
(74) *Attorney, Agent, or Firm* — Muir Patent Law, PLLC

(57) ABSTRACT

In a method of controlling reclaim of a nonvolatile memory device including a plurality of memory blocks, wherein each of the memory blocks includes a plurality of pages, a recovery read operation is performed on first data using an optimal read voltage determined based on the first data, when the first data includes errors which are not correctable, wherein the first data is read from a first page of a first memory block of the memory blocks, and, when the errors of the first data are corrected after the recovery read operation is performed, whether to perform a reclaim of the first page is determined based on threshold voltage distributions of memory cells of the first page, wherein the memory cells are disposed in a region of interest adjacent to the optimal read voltage.

20 Claims, 17 Drawing Sheets

(56) References Cited

U.S. PATENT DOCUMENTS

| | | |
|---|---|---|
| 2013/0159610 A1 | 6/2013 | Kawamura |
| 2014/0101519 A1* | 4/2014 | Lee .................... G06F 11/1068 714/773 |
| 2014/0223246 A1 | 8/2014 | Kim et al. |
| 2014/0237165 A1 | 8/2014 | Seo et al. |
| 2015/0178154 A1 | 6/2015 | Kim et al. |
| 2015/0355845 A1* | 12/2015 | Lee ....................... G06F 3/0679 711/103 |
| 2016/0124647 A1 | 5/2016 | Kim |
| 2016/0132253 A1 | 5/2016 | Chiu |
| 2016/0172046 A1 | 6/2016 | Moon et al. |
| 2016/0246674 A1* | 8/2016 | Chen ................... G06F 11/1068 |

\* cited by examiner

METHODS OF CONTROLLING RECLAIM OF NONVOLATILE MEMORY DEVICES, METHODS OF OPERATING STORAGE DEVICES, AND STORAGE DEVICES

CROSS-REFERENCE TO RELATED APPLICATION

This U.S. application claims priority under 35 USC § 119 to Korean Patent Application No. 10-2016-0131977, filed on Oct. 12, 2016, in the Korean Intellectual Property Office (KIPO), the disclosure of which is incorporated in its entirety by reference herein.

BACKGROUND

1. Technical Field

Exemplary embodiments relate generally to semiconductor memory devices, and more particularly to methods of controlling reclaim of nonvolatile memory devices, methods of operating storage devices and storage devices.

2. Discussion of the Related Art

A semiconductor memory device is a storage device which is fabricated using semiconductors such as, but not limited to, silicon (Si), germanium (Ge), gallium arsenide (GaAs), and indium phosphide (InP). Semiconductor memory devices may be typically classified into a volatile memory and a nonvolatile memory.

The volatile memory may lose contents stored therein at power-off. The volatile memory includes the following: a static RAM (SRAM), a dynamic RAM (DRAM), and a synchronous DRAM (SDRAM). The nonvolatile memory may retain stored contents even at power-off. The nonvolatile memory includes the following: a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

The flash memory may be used in various fields thanks to the following advantages such as a mass storage, low noise, and low power. To increase storage capacity, the flash memory is formed of a multi-level cell which is capable of storing at least two or more bits of data per cell. For example, at least two or more data bits are stored in one memory cell using an increased number of program states, so a read margin between two adjacent program states is reduced. The flash memory having such reduced read margin creates error bits in data generated in a read operation.

In addition, data read from memory cells may include error bits due to physical factors such as program disturbance and read disturbance generated by adjacent memory cells due to fabrication scaling. Such error bits may be corrected using error correcting methods such as an error correction code (ECC) operation. However, it may be useful to detect degraded memory cells even when there are no errors after the ECC operation is performed.

SUMMARY

Some exemplary embodiments are directed to provide a method of controlling reclaim of a nonvolatile memory device, capable of enhancing performance and data reliability.

Some exemplary embodiments are directed to provide a method of operating a storage device, capable of enhancing performance and data reliability.

Some exemplary embodiments are directed to provide a storage device capable of enhancing performance and data reliability.

According to exemplary embodiments, in a method of controlling reclaim of a nonvolatile memory device including a plurality of memory blocks, wherein each of the memory blocks includes a plurality of pages, a recovery read operation is performed on first data using an optimal read voltage determined based on the first data, when the first data includes errors which are not correctable using an error correction code (ECC) operation, wherein the first data is read from a first page of a first memory block of the memory blocks, and, when the errors of the first data are corrected after the recovery read operation is performed, whether to perform a reclaim of the first page is determined based on threshold voltage distributions of memory cells of the first page, wherein the memory cells are disposed in a region of interest adjacent to the optimal read voltage.

According to exemplary embodiments, in a method operating a storage device comprising at least one nonvolatile memory device and a memory controller configured to control the at least one nonvolatile memory device, wherein the at least one nonvolatile memory device includes plurality of memory blocks, and each of the memory blocks includes a plurality of pages, a default read operation is performed on a first page of a first memory block of the memory blocks using a default read voltage set to generate first data, when the first data includes errors which are not correctable, an optimal read voltage is determined based on the first data to perform a recovery read operation on first data based on the optimal read voltage, and when the errors of the first data are corrected after the recovery read operation is performed, whether to perform a reclaim of the first page is determined based on threshold voltage distributions of memory cells of the first page, wherein the memory cells are disposed in a region of interest adjacent to the optimal read voltage.

According to exemplary embodiments, a storage device includes a nonvolatile memory device and a memory controller. The nonvolatile memory device includes a memory cell array including a plurality of memory blocks, and the nonvolatile memory device reads first data from a first page of a first memory block of the memory blocks, in response to a read command and an address. The memory controller applies the read command and the address to the nonvolatile memory device; determines whether the first data includes uncorrectable errors based on default read voltage set; when the first data includes errors which are not correctable by an error correction code (ECC) operation, determines an optimal read voltage based on the first data to perform a recovery read operation on first data based on the optimal read voltage; and when the errors of the first data are corrected after the recovery read operation is performed, determines whether to perform a reclaim of the first page based on threshold voltage distributions of memory cells of the first page, wherein the memory cells are disposed in a region of interest adjacent to the optimal read voltage.

According to exemplary embodiments, in a method of controlling a nonvolatile memory device including a plurality of pages, each page including a plurality of memory cells having a plurality of program states, the method includes performing a first read operation on first data read from a first page of the plurality of pages using a first voltage set; performing a second read operation on the first data using a second voltage, when the first data includes errors which are not correctable by an error correction code (ECC) operation; when the errors of the first data are correctable using the ECC operation by the second read operation, performing at least one of: a) counting a number of memory cells of the first page in a first region defined by the second voltage and a third voltage different from the second voltage, and b) first calculating a slope of a threshold voltage distribution of a second region with respect to the second voltage and a fourth voltage; and selectively performing a reclaim of the first page based on the result of at least one of the performing a) and b). The second region may be defined by the second voltage and the fourth voltage different from the second voltage.

Accordingly, the memory controller performs a recovery read operation on a page of data which includes uncorrectable errors using an optimal read voltage, and determines whether to perform a reclaim of the page based on a threshold voltage distribution around the optimal read voltage, even when the errors of the page are corrected. Therefore, the memory controller may prevent the page from being degraded into an uncorrectable page. Accordingly, performance and data reliability of a storage device may be enhanced.

BRIEF DESCRIPTION OF THE DRAWINGS

Illustrative, non-limiting exemplary embodiments will be more clearly understood from the following detailed description in conjunction with the accompanying drawings.

FIG. 20 is an enlarged diagram of the region of interest in FIG. 19 according to exemplary embodiments.

DETAILED DESCRIPTION

Figure 1:
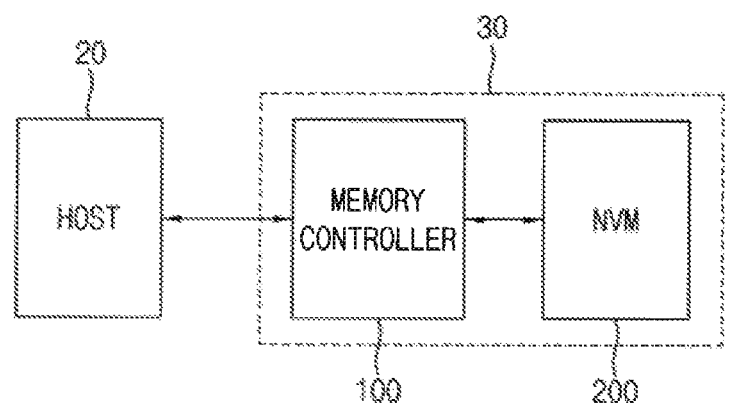
FIG. 1 is a block diagram illustrating an electronic device according to exemplary embodiments.

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

FIG. 1 is a block diagram illustrating an electronic device according to exemplary embodiments.

Referring to FIG. 1, an electronic device 10 may include a host 20 and a store device (or, a memory system) 30. The storage device 30 may include a memory controller 100 and at least one nonvolatile memory device 200. The host 20 may control overall operation of the storage device 30.

The nonvolatile memory device 200 may be implemented with a NAND flash memory. In exemplary embodiments, nonvolatile memory device 200 may be nonvolatile memory device such as Phase Change Random Access Memory (PRAM), Resistance Random Access Memory (RRAM), Magneto-resistive Random Access Memory (MRAM), Ferroelectric random access memory (FRAM), etc.

The memory controller 100 may exchange the signals such as a command, an address, data, etc. with the host 20. The memory controller 100 may write data in the nonvolatile memory device 200 and reads data from the nonvolatile memory device 200 according to a command from the host 20.

Figure 2:
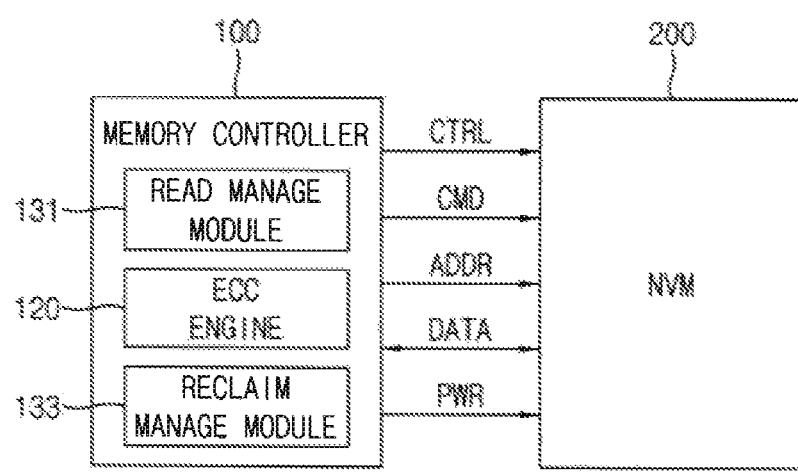
FIG. 2 is a block diagram illustrating the storage device in FIG. 1 according to exemplary embodiments.

FIG. 2 is a block diagram illustrating the storage device in FIG. 1 according to exemplary embodiments.

Referring to FIG. 2, the storage device 30 may include the memory controller 100 and the at least one nonvolatile memory device 200.

In exemplary embodiments, each of the memory controller 100 and the nonvolatile memory device 200 may be provided with a form of a chip, a package, or a module.

Alternatively, the memory controller 100 and the nonvolatile memory device 200 may be packaged one of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (S SOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) and etc.

The nonvolatile memory device 200 may perform a read operation, an erase operation, and a program operation or a write operation under control of the memory controller 100. The nonvolatile memory device 200 receives a command CMD, an address ADDR and data DATA through input/output lines from the memory controller 100 for performing such operations. In addition, the nonvolatile memory device 200 receives a control signal CTRL through a control line from the memory controller 100. In addition, the nonvolatile memory device 200 receives a power PWR through a power line from the memory controller 100.

Memory cells of the nonvolatile memory device 200 may have the physical characteristic that a threshold voltage distribution varies due to causes, such as a program elapsed time, a temperature, program disturbance, read disturbance and etc. For example, data stored at the nonvolatile memory device 200 becomes erroneous due to the above causes. The memory controller 100 utilizes a variety of error correction techniques to correct such errors. For example, the memory controller 100 includes an error correction code (ECC) engine 120, a read manage module 131 and a reclaim manage module 133.

During a read operation, the memory controller 100 may read data stored at a first page of the nonvolatile memory device 200, using a default read voltage set. The default read voltage set may include predetermined read voltages. The ECC engine 120 may detect and correct errors included in data read from the nonvolatile memory device 200. The ECC engine 120 may operate an ECC operation by detecting and correcting errors. In exemplary embodiments, the ECC engine 120 may be implemented in the form of hardware.

Data read in a read operation may include error bits more than the ECC engine 120 may correct. In this case, the ECC engine 120 fails to correct the errors of the data, which may be referred to as an 'uncorrectable error correction code (UECC) error'. Data having the UECC error may be referred to as an 'UECC data'.

When data read by means of the default read voltage set includes the UECC error, for example, the read manage module 131 may adjust a read voltage set of the nonvolatile memory device 200. The memory controller 100 sends an address ADDR, a command CMD, and a control signal CTRL such that the nonvolatile memory device 200 performs a read operation by means of the read voltage set thus adjusted.

The adjusted read voltage set may be included in the control signal CTRL or the command CMD. The ECC engine 120 detects and corrects an error of data that is read using the adjusted read voltage set.

In exemplary embodiments, the read manage module 131 may adjust a read voltage set the predetermined number of times, and the ECC engine 120 may detect and correct an error of data that is read using the adjusted read voltage set. For example, the memory controller 100 may repeat a set of operations the predetermined number of times, adjusting a read voltage set, reading data using the adjusted read voltage set, and correcting an error of the read data.

When an error of read data is corrected during iteration of the set of operations, the memory controller 100 outputs corrected data to the host 20. When a read operation is iterated under a control of the read manage module 131, for example, read data or particular page data of the read data is stored in a buffer 130 in FIG. 3. The buffer 130 may be a static random access memory (SRAM).

When an error of read data is not corrected after iteration of the set of operations (i.e., when the UECC error occurs), the memory controller 100 determines a starting voltage set for performing a valley search operation based on the data stored in the buffer 130.

In exemplary embodiments, iteration of adjusting a read voltage set and reading data using the adjusted read voltage set may be omitted.

When an error of read data is not corrected after the read operation based on the default read voltage set or after iteration of the adjusted read voltage set of operations, the memory controller 100 selects a program state which includes a highest error bit ratio, among the data stored in the buffer 130 and determines a read voltage corresponding to the selected program state as the starting voltage set. The read manage module 131 performs a valley search operation based on the determined read voltage of the starting voltage set to determine an optimal read voltage and performs a recovery read operation on the read data based on the optimal read voltage.

For determining the optimal read voltage, the read manage module 131 sets a search region defined by a starting read voltage and ending read voltage, determines whether the search region belongs to a reference region, changes the search region if the search region does not belong to the reference region, and finds new read voltage to determine the optimal read voltage if the search region belongs to the reference region. For example, the optimal read voltage represents a threshold voltage corresponding to a valley of overlapping regions of two program states of a plurality of program states of the memory cells of one page.

When an error of read data is corrected (for example, the read data includes correctable errors or no error) using an error correction code (ECC) operation after the recovery read operation based on the optimal read voltage, the ECC engine 120 notifies the reclaim manage module 133 of the error of the read data being corrected.

The reclaim manage module 133 determines whether to perform a reclaim of the first page based on threshold voltage distributions of memory cells in a region of interest (ROI) near the optimal read voltage, of the first page. The memory controller 100 may determine whether to perform a reclaim of the first page based on threshold voltage distributions of memory cells in the region of interest even when the error of the read data from the first page is correctable after the recovery read operation based on the optimal read voltage.

When the first page is determined to be reclaimed, the memory controller 100 perform a reclaim on the first page and may detect a degraded page and a sudden power off (SPO) page which cannot be detected by error-bit based reclaim determination. Therefore, degrading of a page into an uncorrectable page may be prevented. The sudden power off page means that a power of the nonvolatile memory device 200 is off during a program operation of a particular page. Thus, program states of the sudden power off page may be unstable.

Figure 3:
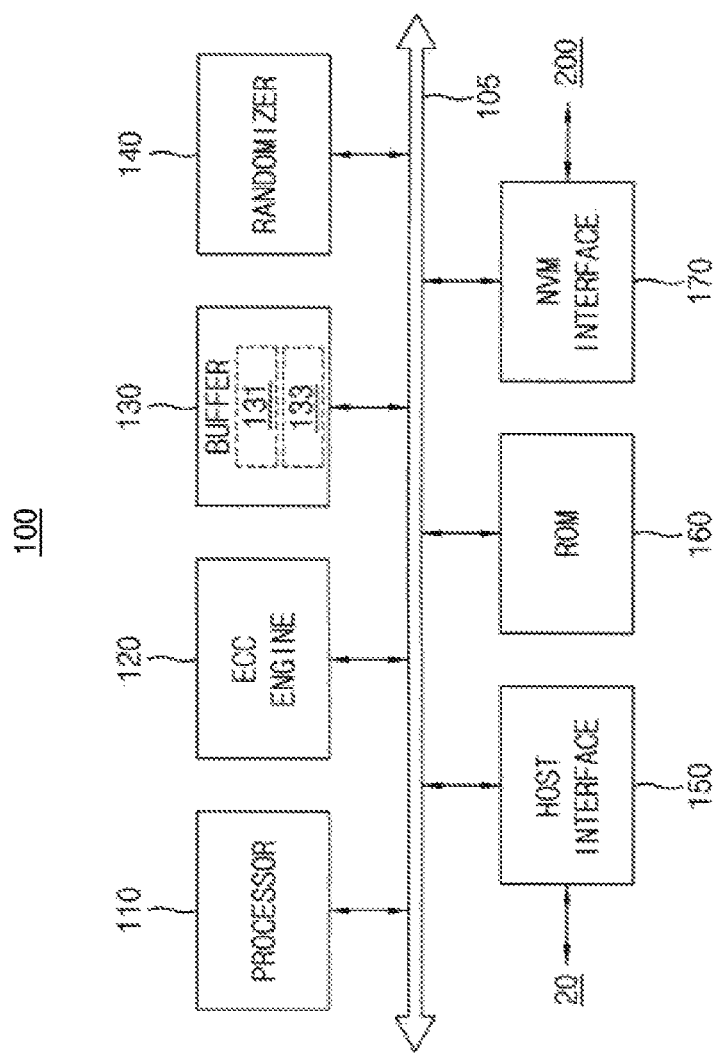
FIG. 3 is a block diagram illustrating the memory controller in the storage device of FIG. 2 according to exemplary embodiments.

FIG. 3 is a block diagram illustrating the memory controller in the storage device of FIG. 2 according to exemplary embodiments.

Referring to FIGS. 2 and 3, the memory controller 100 may include a processor 110, the ECC engine 120, the buffer 130, the read manage module 131, the reclaim manage module 133, a randomizer 140, a host interface 150, a read only memory (ROM) 160 and a nonvolatile memory interface 170 which are connected via a bus 105. The ECC engine 120, the buffer 130, the read manage module 131 and the reclaim manage module 133 are described with reference to FIG. 2, and a description thereof is thus omitted.

The processor 110 controls an overall operation of the memory controller 100. In exemplary embodiments, the read manage module 131 and the reclaim manage module 133 may be implemented in software and stored in the buffer 130. The read manage module 131 and the reclaim manage module 133 stored in the buffer 130 may be driven by the processor 110. The ROM 160 stores a variety of information, needed for the memory controller 100 to operate, in firmware.

The randomizer 140 randomizes data to be stored in the nonvolatile memory device 200. For example, the randomizer 140 randomizes data to be stored in the nonvolatile memory device 200 in a unit of a word-line.

Data randomizing is to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 140 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 140 de-randomizes data read from the nonvolatile memory device 200.

The randomizer 140 randomizes page data. For the sake of easy understanding, an ideal operation of the randomizer 140 is described. However, the inventive concept is not limited thereto. For example, the randomizer 140 randomizes data such that in memory cells connected to one word-line, the number of memory cells having the erase state, the number of memory cells having the first program state, the number of memory cells having the second program state, and the number of memory cells having the third program state are approximate to the same value. For example, memory cells in which randomized data is stored have program states of which the number is similar to one another.

The memory controller 100 communicates with the host 20 through the host interface 150. For example, the host interface 150 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 100 communicates with the nonvolatile memory device 200 through the nonvolatile memory interface 170.

Figure 4:
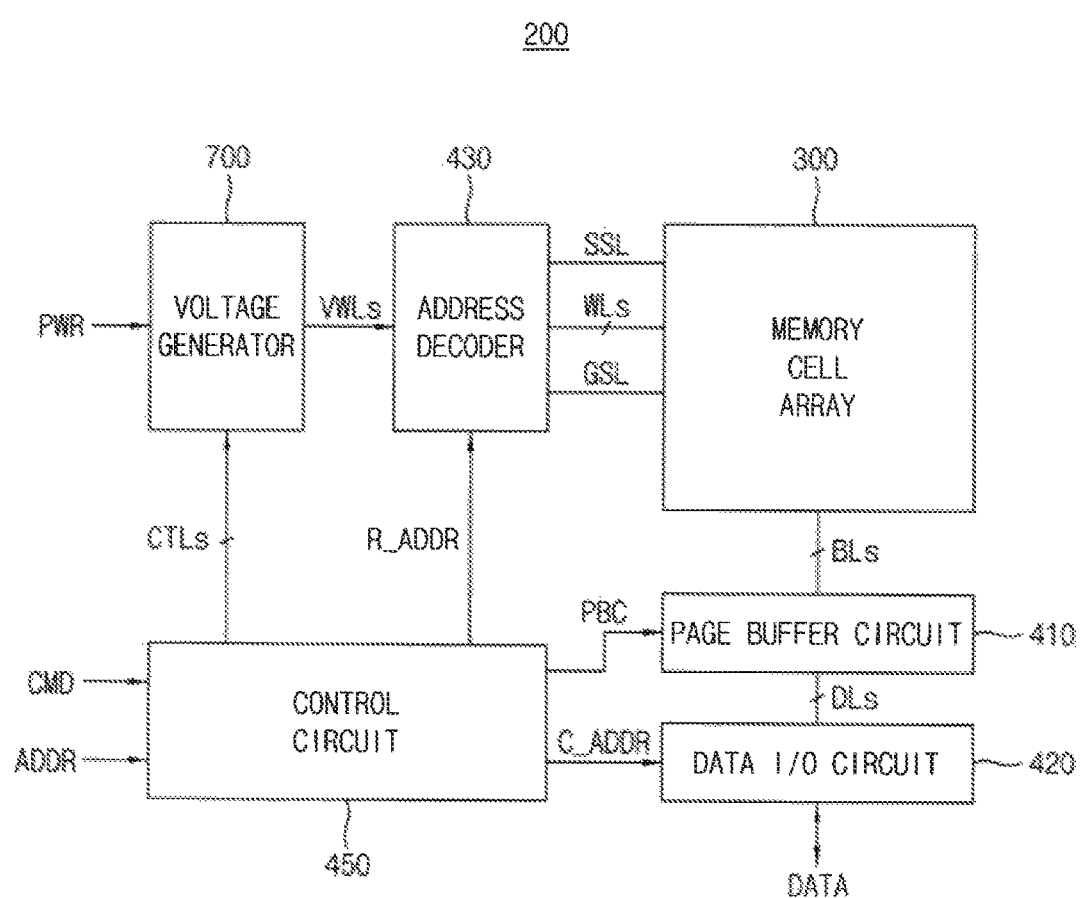
FIG. 4 is a block diagram illustrating the nonvolatile memory device in the storage device of FIG. 2 according to exemplary embodiments.

FIG. 4 is a block diagram illustrating the nonvolatile memory device in the storage device of FIG. 2 according to exemplary embodiments.

Referring to FIG. 4, the nonvolatile memory device 200 includes a memory cell array 300, an address decoder 430, a page buffer circuit 410, a data input/output circuit 420, a control circuit 450 and a voltage generator 700.

The memory cell array 300 may be coupled to the address decoder 430 through a string selection line SSL, a plurality of word-lines WLs, and a ground selection line GSL. In addition, the memory cell array 300 may be coupled to the page buffer circuit 410 through a plurality of bit-lines BLs.

The memory cell array 300 may include a plurality of memory cells coupled to the plurality of word-lines WLs and the plurality of bit-lines BLs.

In some exemplary embodiments, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 300 may be a two-dimensional memory cell array, which is formed on a substrate in a two-dimensional structure (or a horizontal structure).

Referring still to FIG. 4, the address decoder 430 may select at least one of a plurality of memory blocks of the memory cell array 300 in response to an address ADDR from the memory controller 100. For example, the address decoder 430 may select at least one of a plurality of word lines in the selected one or more memory blocks. The address decoder 430 may transfer a voltage (e.g., a word-line voltage) generated from the voltage generator 700 to a selected word line. At a program operation, the address decoder 430 may transfer a program voltage or a verification voltage to a selected word line and a pass voltage to an unselected word line. At a read operation, the address decoder 430 may transfer a selection read voltage to a selected word line and a non-selection read voltage (or, pass voltage) to an unselected word line.

The page buffer circuit 410 may operate as a write driver at a program operation and a sense amplifier at a read operation. At a program operation, the page buffer circuit 410 may provide a bit line of the memory cell array 300 with a bit line voltage corresponding to data to be programmed. At a read or verification read operation, the page buffer circuit 410 may sense data stored in a selected memory cell via a bit line. The page buffer circuit 410 may include a plurality of page buffers PB1 to PBn each connected with one or more bit lines.

The control circuit 450 may generate a plurality of control signals CTLs and a page buffer control signal PBC based on the command signal CMD. The control circuit 450 may also generate a row address R_ADDR and a column address C_ADDR based on the address signal ADDR. A detailed description for the control circuit 450 will be described later.

In example embodiments, the nonvolatile memory device 200 may further include a voltage generator (not shown) for supplying a variable voltage to a selected bit-line of the memory cell array 300 through the page buffer circuit 410. In other example embodiments, the page buffer circuit 410 may include the voltage generator (not shown) applying a variable voltage to a selected bit-line of the memory cell array 300.

Figure 5:
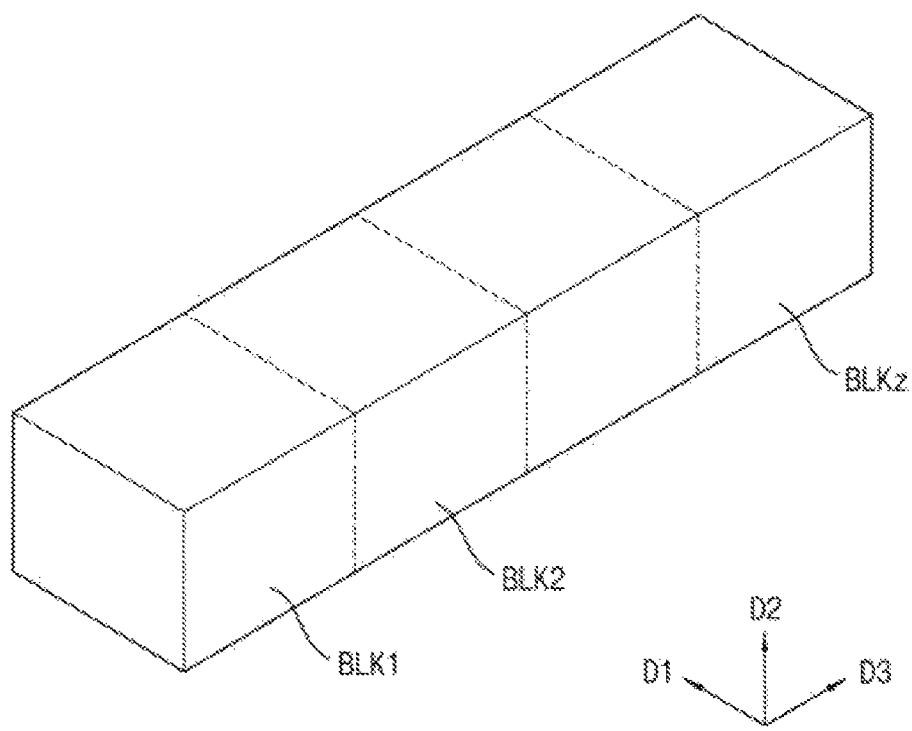
FIG. 5 is a block diagram illustrating the memory cell array in FIG. 4 according to exemplary embodiments.

FIG. 5 is a block diagram illustrating the memory cell array in FIG. 4 according to exemplary embodiments.

Referring to FIG. 5, the memory cell array 300 may include a plurality of memory blocks BLK1 to BLKz. In an embodiment, the memory blocks BLK1 to BLKz are selected by the address decoder 430 in FIG. 4. For example, the address decoder 430 may select a particular memory block BLK corresponding to a block address among the memory blocks BLK1 to BLKz.

Figure 6:
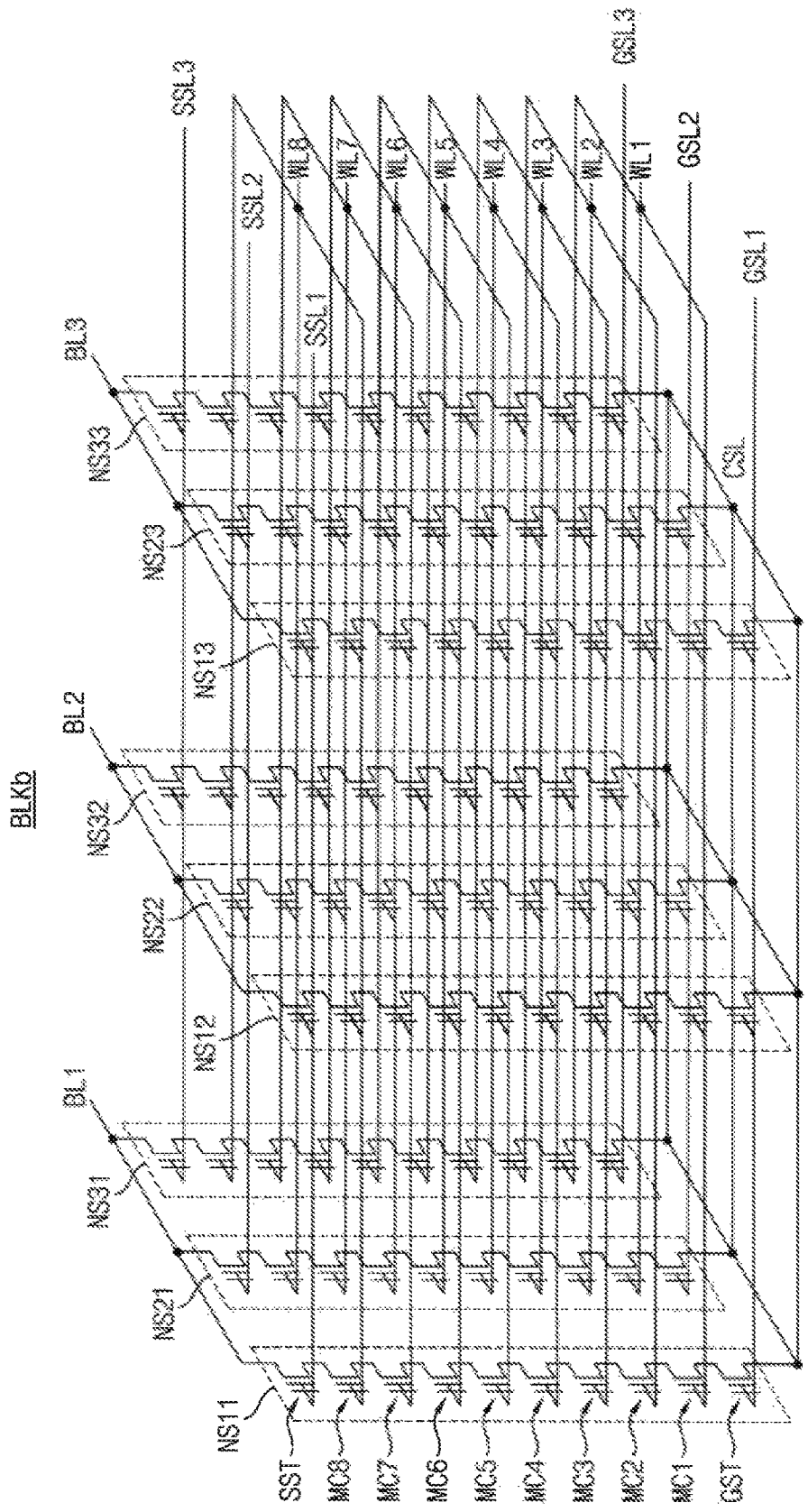
FIG. 6 is a circuit diagram illustrating one of the memory blocks in FIG. 5 according to exemplary embodiments.

FIG. 6 is a circuit diagram illustrating one of the memory blocks in FIG. 5 according to exemplary embodiments.

The memory block BLKb of FIG. 6 may be formed on a substrate in a three-dimensional structure (or a vertical structure). For example, a plurality of memory cell strings included in the memory block BLKb may be formed in a direction perpendicular to the substrate.

Referring to FIG. 6, a memory block BLKb may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated to include eight memory cells MC1 to MC8. However, exemplary embodiments are not limited thereto. In some exemplary embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 6, the memory block BLKb is illustrated to be coupled to eight word-lines WL1 to WL8 and three bit-lines BL1 to BL3. However, exemplary embodiments are not limited thereto. In some exemplary embodiments, the memory cell array 300 may be coupled to any number of word-lines and bit-lines.

Referring back to FIG. 4, the control circuit 450 may receive a command (signal) CMD and an address (signal) ADDR from the memory controller 100 and control an erase loop, a program loop and a read operation of the nonvolatile memory device 200 based on the command signal CMD and the address signal ADDR. The program loop may include a program operation and a program verification operation. The erase loop may include an erase operation and an erase verification operation. The read operation may include a default read operation and recovery read operation.

In example embodiments, the control circuit 450 may generate the control signals CTLs, which are used for controlling the voltage generator 700, and may generate the page buffer control signal PBC for controlling the page buffer circuit 410, based on the command signal CMD, and generate the row address R_ADDR and the column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 300 through the string selection line SSL, the plurality of word-lines WLs, and the ground selection line GSL. During the program operation or the read operation, the address decoder 430 may determine one of the plurality of word-lines WLs as a selected word-line and determine rest of the plurality of word-lines WLs except for the selected word-line as unselected word-lines based on the row address R_ADDR.

The voltage generator 700 may generate word-line voltages VWLs, which are required for the operation of the memory cell array 300 of the nonvolatile memory device 200, based on the control signals CTLs. The voltage generator 700 may receive the power PWR from the memory controller 100. The word-line voltages VWLs may be applied to the plurality of word-lines WLs through the address decoder 430.

For example, during the erase operation, the voltage generator 700 may apply an erase voltage to a well of a memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the default read operation, the voltage generator 700 may apply a default read voltage to the selected word-line and may apply a read pass voltage to the unselected word-lines. During the recovery read operation, the voltage generator 700 may apply the optimal read voltage to the selected word-line.

The page buffer circuit 410 may be coupled to the memory cell array 300 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DLs. During the program operation, the data input/output circuit 410 may receive program data DATA from the memory controller 100 and provide the program data DATA to the page buffer circuit 410 based on the column address C_ADDR received from the control circuit 450. During the read operation, the data input/output circuit 420 may provide read data DATA, which are stored in the page buffer circuit 410, to the memory controller 100 based on the column address C_ADDR received from the control circuit 450.

In addition, the page buffer circuit 410 and the data input/output circuit 420 read data from a first area of the memory cell array 300 and write the read data to a second area of the memory cell array 300. That is, the page buffer circuit 410 and the data input/output circuit 420 may perform a copy-back operation.

Figure 7:
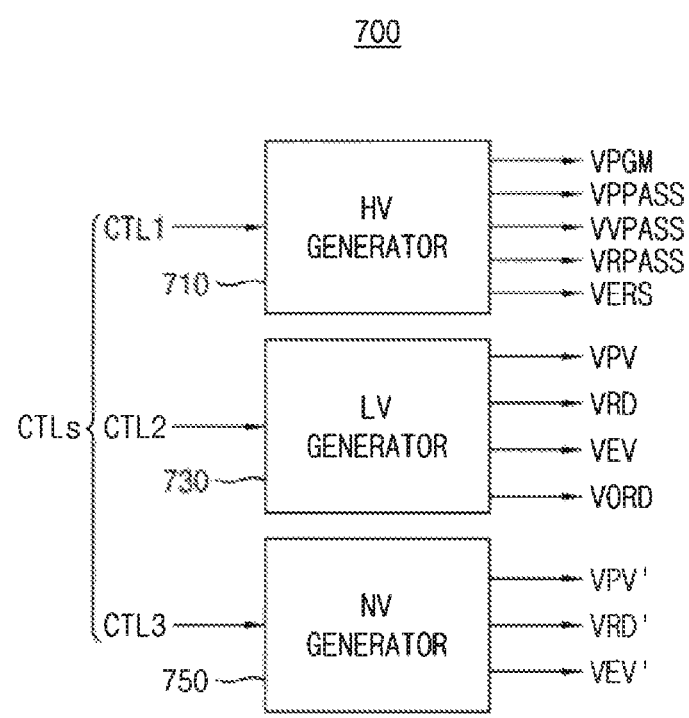
FIG. 7 is a block diagram illustrating the voltage generator in the nonvolatile memory device of FIG. 4 according to exemplary embodiments.

FIG. 7 is a block diagram illustrating the voltage generator in the nonvolatile memory device of FIG. 4 according to exemplary embodiments.

Referring to FIG. 7, the voltage generator 700 may include a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by a command CMD, in response to a first control signal CTL1 of the control signals CTLs. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the command CMD.

The low voltage generator 730 may generate a program verification voltage VPV, a read voltage VRD, an erase verification voltage VEV and an optimal read voltage VORD according to operations directed by the command CMD, in response to a second control signal CTL2 of the control signals CTLs. The program verification voltage VPV, the read voltage VRD, the optimal read voltage VORD and the erase verification voltage VEV may be applied to the selected word-line according to operation of the nonvolatile memory device 200. The second control signal CTL2 may include a plurality of bits which indicate the operations directed by the command CMD.

The negative voltage generator 750 may generate a program verification voltage VPV', a read voltage VRD' and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

Figure 8A:
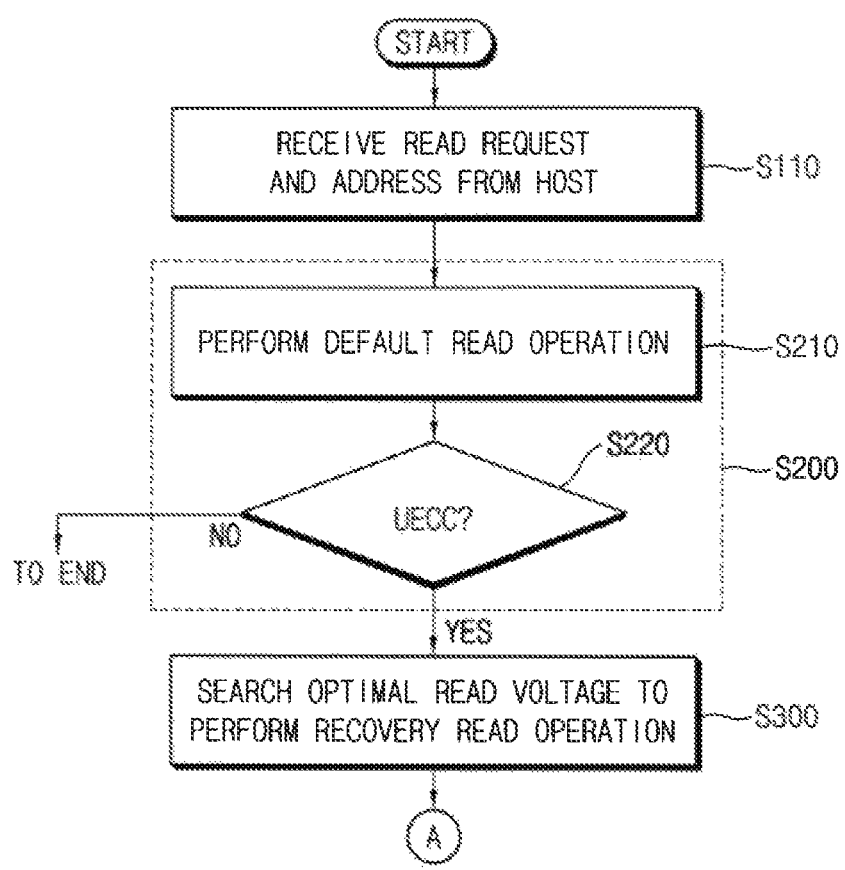
FIGS. 8A and 8B are flow charts illustrating a method of operating a storage device according to exemplary embodiments.
Figure 8B:
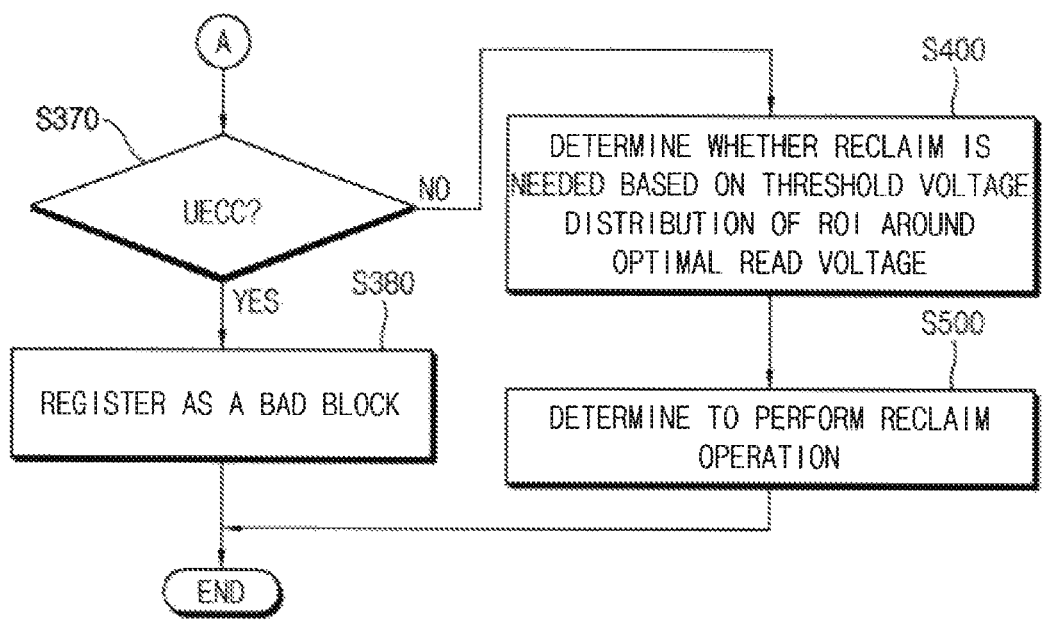

FIGS. 8A and 8B are flow charts illustrating a method of operating a storage device according to exemplary embodiments.

For the convenience of description, it is assumed that the read manage module 131 includes a predefined table (PDT) and the read manage module 131 controls a read operation using the PDT. However, the inventive concept is not limited thereto. For example, the read manage module 131 may include information about methods of selecting any other voltage sets such as a program time stamp table. In addition, the recovery read operation managed by read manage module 131 is a read operation based on a valley value detected by a valley search operation.

A read voltage set may include a plurality of read voltages for determining program states of memory cells. The read voltage set may be adjusted by the memory controller 100. Data that is read from the nonvolatile memory device 200 based on the read voltage set may be referred to as 'a first default data'. The first default data is data before error detection and correction is performed by the ECC engine 120.

Referring to FIGS. 2 through 7, 8A, and 8B, in S110, the memory controller 100 receives a read request and an address from the host 20.

In step S200, the memory controller 100 performs a default read operation in response to the received read request and the address, and step S200 includes steps S210 and S220.

When the read request is received, in step S210, the memory controller 100 performs a read operation on a first page (or, memory cells connected to a first word-line) corresponding to the received address using a default read voltage set. It is assumed that the first page is a particular page of a first memory block of a plurality of memory blocks in the memory cell array 300.

In step S220, the memory controller 100 determines whether data (hereinafter, referred to as the first default data) read using the default read voltage set includes an UECC error. For example, the ECC engine 120 detects and corrects errors of the first default data.

When errors of the first default data are all corrected (NO in S220, i.e., no UECC error exists), the read operation ends and the memory controller 100 de-randomize the corrected data to send the de-randomized data to the host 20.

When errors of the default raw data are not corrected (YES in S220, i.e., an UECC error exists), the memory controller 100 stores the first default data in the buffer 130.

In step S300, the memory controller 100 selects a starting voltage, or a starting voltage set based on the first default data stored in the buffer 130, performs a read operation based on the starting voltage to perform a valley search operation to search a valley value of threshold voltage distribution of the memory cells of the first page, determines an optimal read voltage, and performs a recovery read operation on the data of the first page based on the optimal read voltage.

In step S370, the memory controller 100 determines whether a second default data read from the first page using the optimal read voltage includes an UECC error. For example, the ECC engine 120 detects and corrects errors of the second default data.

When errors of the default raw data are not correctable (YES in S370, i.e., an UECC error exists), the memory controller 100 registers a memory block including the first page as a bad block in step S380.

When errors of the second default data are all corrected (NO in S370, i.e., no UECC error exists), the memory controller 100 stores the second default data in the buffer 130 and determines whether to perform a reclaim of the first page based on a threshold voltage distribution of the memory cells in a region of interest (ROI) around the optimal read voltage using the reclaim manage module 133 in step S400.

In step S500, if the first page is determined to be reclaimed, the memory controller 100 performs a reclaim operation on the first page.

Figure 9:
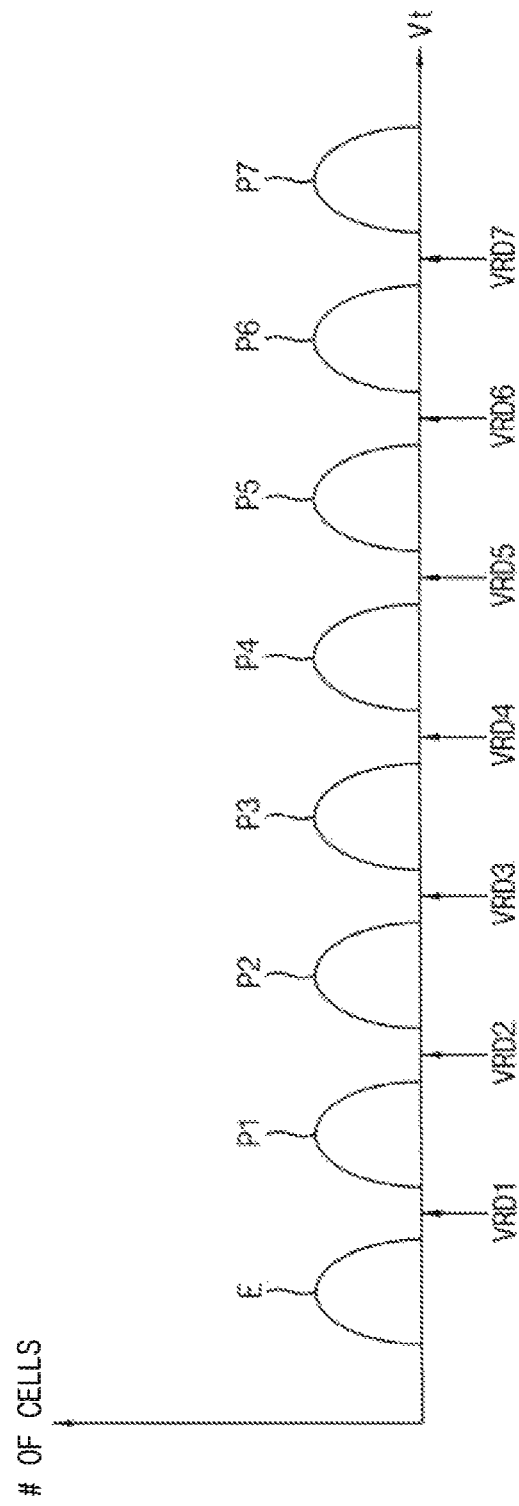
FIGS. 9 to 11 are diagrams for explaining the step S200 in FIG. 8A according to exemplary embodiments.
Figure 10:
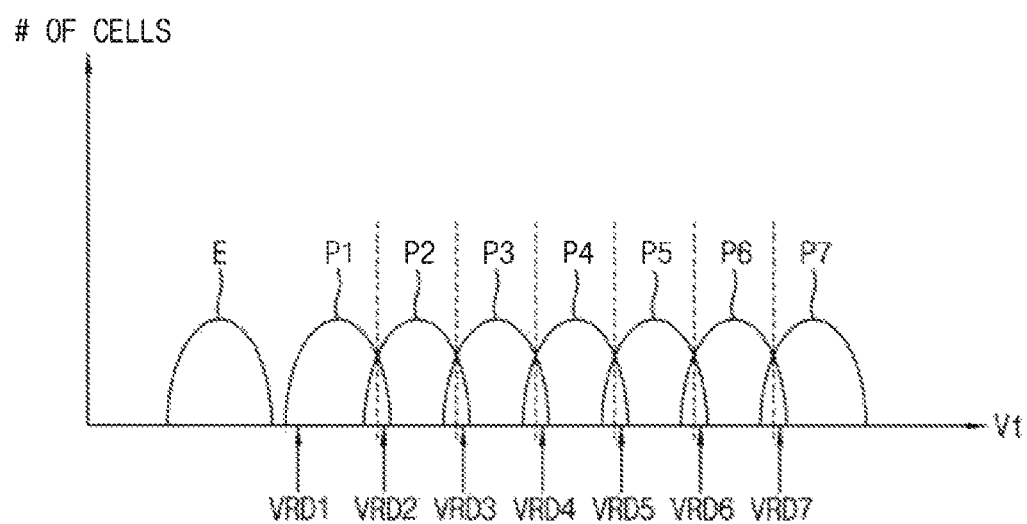
Figure 11:
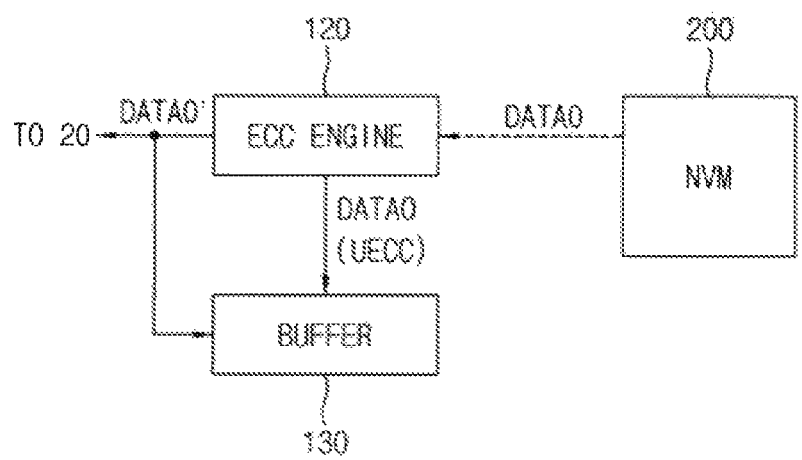

FIGS. 9 to 11 are diagrams for explaining the step S200 in FIG. 8A according to exemplary embodiments.

For the convenience of description, it is assumed that memory cells of a nonvolatile memory device 200 are triple level cells (TLC) each storing three bits and a read voltage set for determining program states of memory cells includes seven read voltages. In addition, it is assumed that the read manage module 131 includes a PDT and adjusts a read voltage set using the PDT. However, the inventive concept is not limited thereto.

Referring to FIGS. 2 through 7, 8A, 8B, and 9, each memory cell of the nonvolatile memory device 200 has one of an erase state E and first through seventh program states P1 through P7. Under a control of the memory controller 100, the nonvolatile memory device 200 determines program states of memory cells using a default read voltage set VRD1 through VRD7 and outputs the first default data DATA0 as the determination result.

Voltage levels of the default read voltage set VRD1 through VRD7 may be predetermined depending on cell characteristics. For example, voltage levels of the default read voltage set VRD1 through VRD7 are predetermined depending on a threshold voltage distribution just after memory cells are programmed. Alternatively, voltage levels of the default read voltage set VRD1 through VRD7 are predetermined depending on a threshold voltage distribution after memory cells are programmed and then a time elapses (i.e., memory cells are stabilized).

Referring to FIGS. 10 and 11, a threshold voltage distribution of memory cells varies due to physical characteristics of memory cells or external factors as an elapsed time after the memory cells are programmed, as illustrated in FIG. 10. For example, charge trap flash (CTF) memory cells may experience initial verify shift (IVS) that a threshold voltage distribution of the memory cells shifts toward a relatively low voltage as an elapsed time after the memory cells are programmed. In addition, threshold voltage distributions of the memory cells overlaps due to SPO during the program operation, as illustrated in FIG. 10. For this reason, the first default data DATA0 read through a read operation using the default read voltage set VRD1 through VRD7 may include an error.

The memory controller 100 detects and corrects an error of the first default data DATA0 thus read. When errors of the first default data DATA0 are corrected, the memory controller 100 sends the corrected data DATA0' to the host 20. In exemplary embodiments, the memory controller 100 de-randomizes the corrected data DATA0' and sends the de-randomized data to the host 20. The memory controller 100 may store the corrected data DATA0' in the buffer 130.

When errors of the first default data DATA0 are not correctable (i.e., the number of errors in the first default data DATA0 exceeds an error correction capacity of the ECC engine 120 or the first default data DATA0 includes an UECC error) using an ECC operation, the memory controller 100 may store the first default data DATA0 in the buffer 130 and may perform a recovery read operation by using the read manage module 131.

Figure 12:
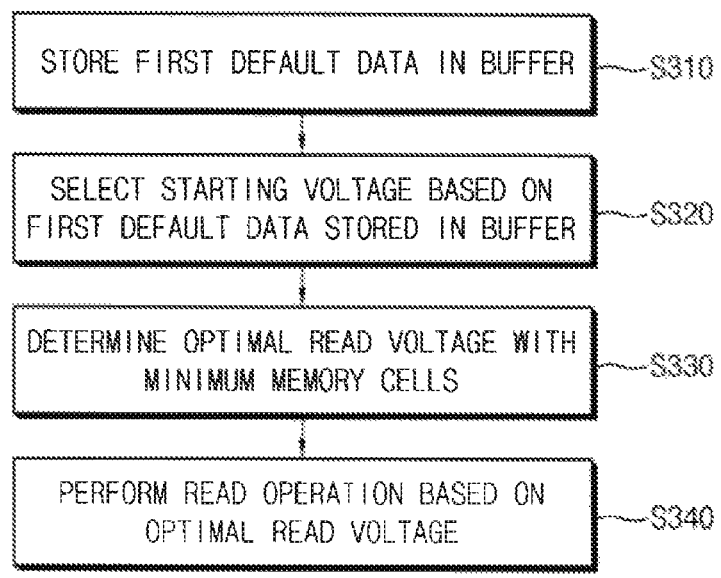
FIGS. 12 to 14 are diagrams for explaining step S300 in FIG. 8A according to exemplary embodiments.
Figure 13:
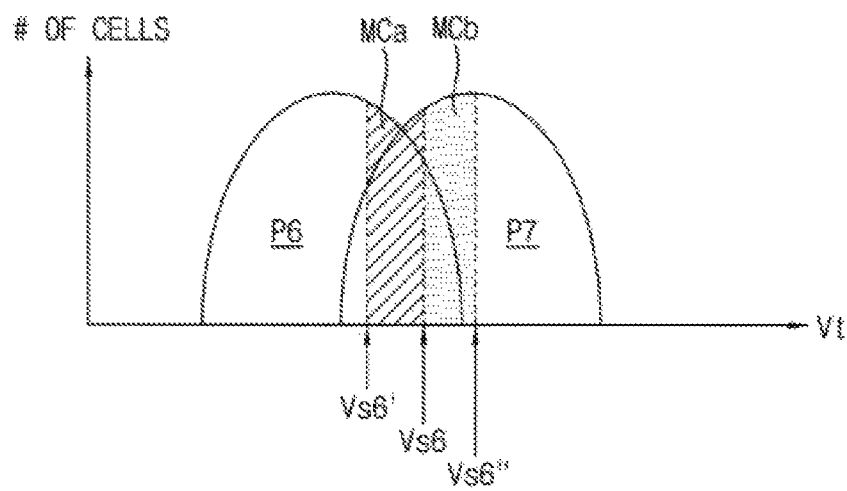
Figure 14:
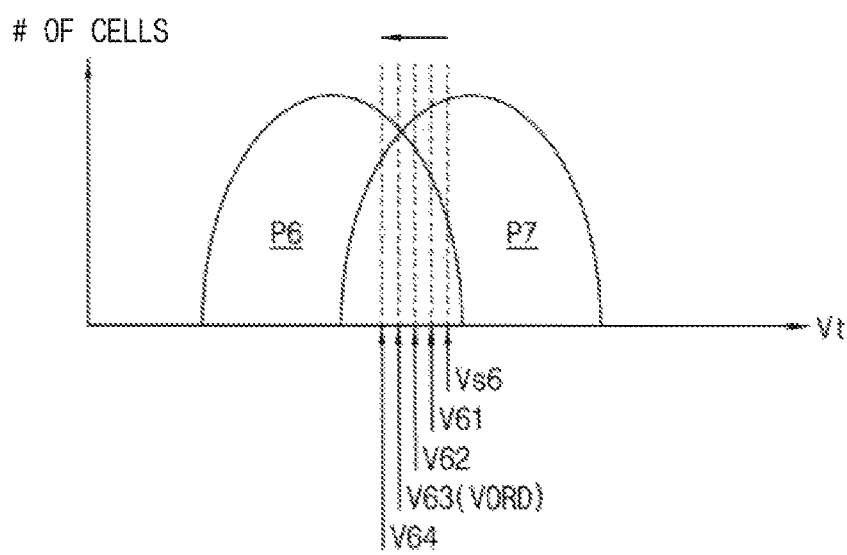

FIGS. 12 to 14 are diagrams for explaining step S300 in FIG. 8A according to exemplary embodiments.

Referring to FIG. 12, step S300 includes steps S310, S320, S330 and S340.

In step S310, when errors of the first default data DATA0 are not correctable by an ECC operation, the memory controller 100 stores the first default data DATA0 in the buffer 130.

As described with reference to FIG. 3, the memory controller 100 includes the randomizer 140. The randomizer 140 randomizes data to be stored in the nonvolatile memory device 200. For example, the randomizer 140 may randomizes data to be stored in each page so that each page has substantially the same number of program states of memory cells. In this case, the data with the highest error bit rate may be first default data having the greatest difference among the numbers of program states, among the first default data DATA0 stored in the buffer 130.

In step S320, the memory controller 100 selects, as a starting voltage, a read voltage used to read data, which causes the greatest number of cells between the numbers of memory cells having respective program states, based on the first default data DATA0 stored in the buffer 130.

FIGS. 13 and 14 are diagrams for explaining step S330 in FIG. 12.

A valley search operation will be exemplarily described with reference to FIGS. 12 and 13. For brevity of description, an operation of searching a valley value between sixth and seventh program states P6 and P7 will be described. However, the inventive concept is not limited thereto.

When an error is not correctable at a read operation based on the default read voltage, the memory controller 100 performs a valley search operation using the selected starting voltage to determine the optimal read voltage and performs a recovery read operation based on the optimal read voltage.

The read manage module 131 may include information, or a program codes, or program instructions for the valley search operation. The memory controller 100 performs the valley search operation using the selected starting voltage. The memory controller 100, for example, selects the starting voltage. For example, as illustrated in FIG. 13, a starting voltage Vs6 is used as a starting voltage for searching a valley value between the sixth and seventh program states P6 and P7.

The memory controller 100 performs a read operation using the starting voltage Vs6 to search a valley value between the sixth and seventh program states P6 and P7. A read operation is, then, performed using a voltage Vs6' lower by a predetermined level than the starting voltage Vs6 and a read operation is performed using a voltage Vs6" higher by a predetermined level than the starting voltage Vs6.

The memory controller 100 searches a valley value depending on data read using the starting voltage Vs6, data read using the voltage Vs6', and data read using the voltage Vs6". For example, the memory controller 100 detects memory cells MCa, each having a threshold voltage between the starting voltage Vs6 and the voltage Vs6', depending on the data read using the starting voltage Vs6 and the data read using the voltage Vs6'. Moreover, the memory controller 100 detects memory cells MCb, each having a threshold voltage between the starting voltage Vs6 and the voltage Vs6", depending on the data read using the starting voltage Vs6 and the data read using the voltage Vs6".

FIG. 14 is a diagram for explaining valley search operation different from FIG. 13.

Referring to FIG. 14, the memory controller 100 performs a read operation using the starting voltage Vs6. The memory controller 100, then, performs a read operation using a voltage V61 lower by a predetermined level than the starting voltage Vs6. The memory controller 100 detects memory cells, each having a threshold voltage between the starting voltage Vs6 and the voltage V61, depending on the data read using the starting voltage Vs6 and the data read using the voltage V61.

The memory controller 100 iterates a read operation with a read voltage with lowered voltages Vs62, Vs63, and Vs64. The memory controller 100 detects a number of memory cells, each having a threshold voltage between the two voltages (e.g., (Vs61 and Vs62), (Vs62 and Vs63), and (Vs63 and Vs64)), depending on the read data. The memory controller 100 detects the valley value depending on variations in the numbers of memory cells thus detected. In FIG. 14 the voltage VD63 is determined as the optimal read voltage VORD.

An operating method described with reference to FIGS. 13 and 14 is exemplary. However, the inventive concept is not limited thereto. For example, the memory controller 100 may perform a valley search operation different from that described with reference to FIGS. 13 and 14. For example, the memory controller 100 may select the optimal read voltage by means of any other operating method except the valley search operation such as peak value detection or detection of lower limit of a threshold voltage distribution and perform a read operation using the optimal read voltage thus selected.

In exemplary embodiments, the valley value includes a plurality of valley values, and a voltage corresponding to the maximum value of the plurality of valley values may be determined as the optimal read voltage. In addition, the memory controller 100 may determine each of the plurality of valley values as the optimal read voltage and may perform above-described recovery read operation.

Figure 15:
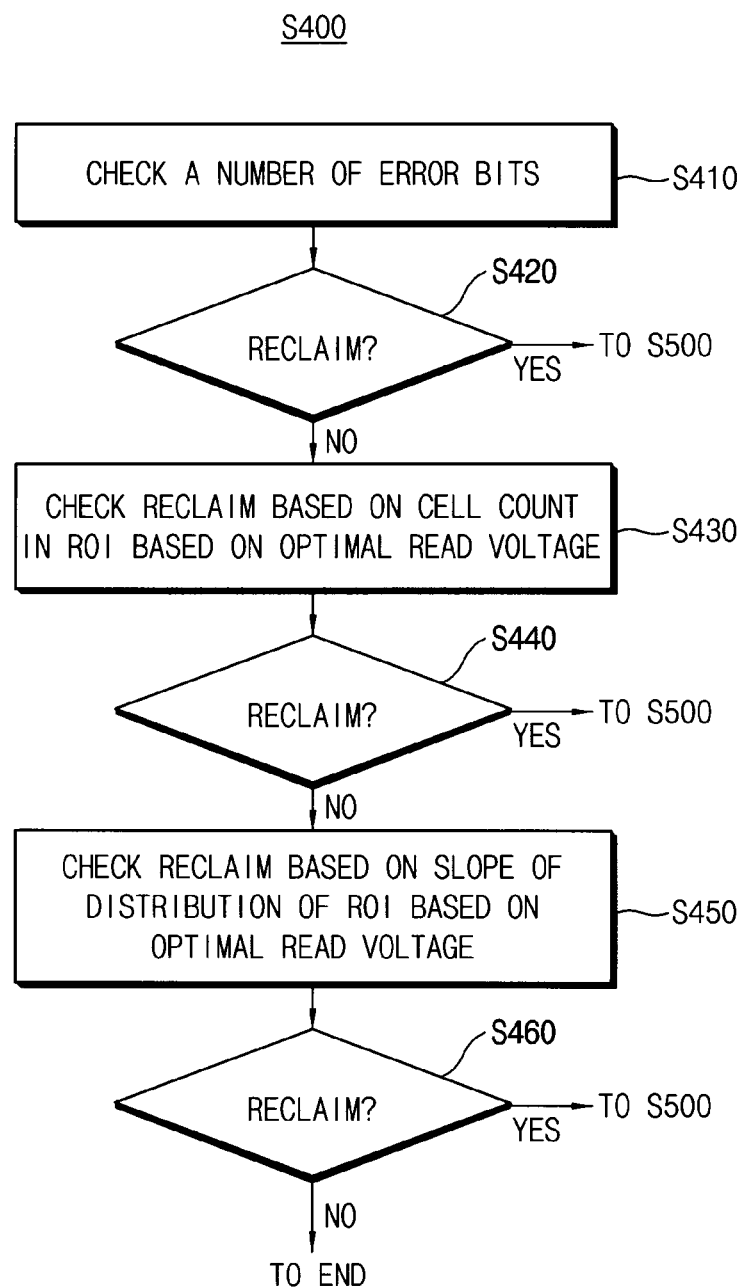
FIG. 15 is a flow chart illustrating step S400 in FIG. 8B according to exemplary embodiments.

FIG. 15 is a flow chart illustrating step S400 in FIG. 8B according to exemplary embodiments.

Step S400 may be a flow chart illustrating a method of controlling reclaim of a nonvolatile memory device according to exemplary embodiments.

Referring to FIG. 15, step S400 includes steps S410, S420, S430, S440, S450 and S460.

In step S410, the ECC engine 120 checks a number of error bits in the second default data read using the optimal read voltage and may provide the reclaim manage module 133 with information on the number of error bits.

In step S420, the reclaim manage module 133 compares the number of error bits in the second default data with a reference value, determines the first page to be reclaimed if the number of error bits is equal to or greater than the reference value and performs a reclaim operation on the first page.

Reclaiming one page means that corrected data of the one page is programmed into another page physically different from the one page before errors of the one page become uncorrectable although the errors in the one page are corrected by the recovery read operation, because the errors in the one page may have a great possibility of becoming uncorrectable as a short time elapses when the one page is programmed.

In step S430, for checking a reclaim of the first page, the reclaim manage module 133 counts a number of memory cells in a region of interest (ROI) around the optimal read voltage VORD.

In step S440, the reclaim manage module 133 may selectively determine whether to perform a reclaim of the first page based on the number of memory cells in the region of interest.

When the first page is determined not to be reclaimed in step S440 (NO in S440), in step S450, the reclaim manage module 133 may check a reclaim of the first page based on a slope of a threshold voltage distribution of the region of interest with respect to the optimal read voltage VORD.

In example embodiments, the reclaim manage module 133 may determine whether to perform a reclaim of the first page based on the number of memory cells of distribution of ROI without performing steps S450 and S460.

In other example embodiments, the reclaim manage module 133 may determine whether to perform a reclaim of the first page based on the slope of distribution of the ROI with respect to the optimal read voltage VORD without performing steps S430 and S440. Thus, the reclaim manage module 133 may determine whether to perform a reclaim of the first page based on a result of at least one of counting a number of memory cells of the first page in the ROI and calculating a slope of a threshold voltage distribution of the ROI with respect to the optimal read voltage VORD.

Figure 16:
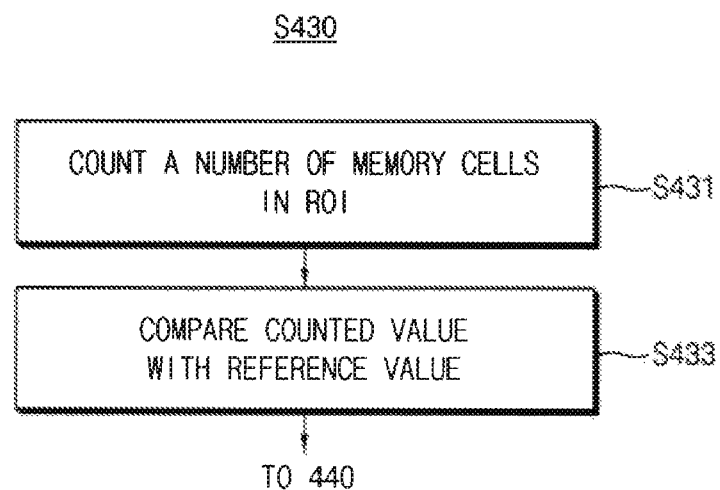
FIGS. 16 and 17 are diagrams for explaining step S430 in FIG. 15 according to exemplary embodiments.
Figure 17:
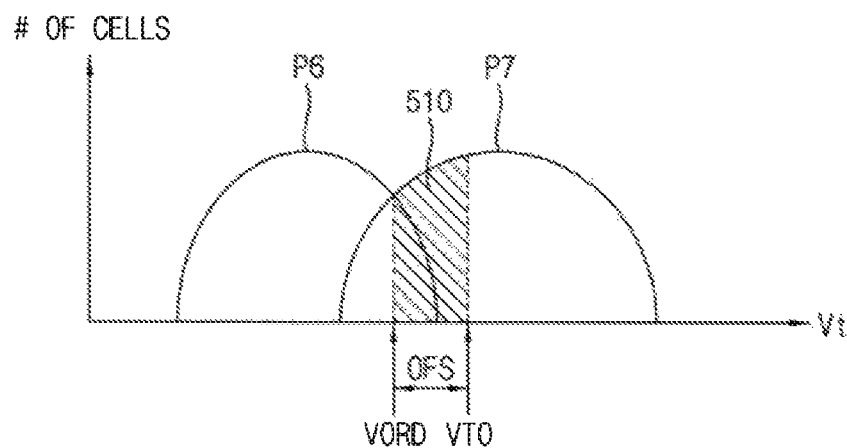

FIGS. 16 and 17 are diagrams for explaining step S430 in FIG. 15 according to exemplary embodiments.

In FIG. 17, for brevity of description, it is assumed that a valley value exits in overlapping regions of the sixth and seventh program states P6 and P7, and a region of interest 510 is a region defined by the optimal read voltage VORD and a first voltage VTO1 which is greater than the optimal read voltage VORD by an offset voltage OFS.

Referring to FIG. 16, step S430 includes steps S431 and S433.

In step S431, the reclaim manage module 133 counts a number of memory cells in the region of interest 510.

In step S433, the reclaim manage module 133 compares the counted number of memory cells with the reference value. The reference value may indicates a number of memory cells in the region of interest 510 when the data of the first page include no errors and the reference value may be pre-stored in the reclaim manage module 133.

In exemplary embodiments, counting the number of memory cells in the region of interest 510 may include counting a first number of memory cells which are turned-on by applying the first voltage VTO1 to a first word-line coupled to the first page, counting a second number of memory cells which are turned-on by applying the optimal read voltage VORD to the first word-line, and subtracting the second number from the first number.

In exemplary embodiments, counting the number of memory cells in the region of interest 510 may include counting a first number of memory cells which are turned-off by applying the optimal read voltage VORD to a first word-line coupled to the first page, counting a second number of memory cells which are turned-off by applying the first voltage VTO1 to the first word-line, and subtracting the second number from the first number.

The number of the memory cells in the region of interest 510 may indicates a degradation degree of a program state corresponding to the region of interest 510. As the program state corresponding to the region of interest 510 is more degraded, the number of the memory cells in the region of interest 510 increases more. Therefore, whether to perform reclaim of the first page may be determined by counting the number of the memory cells in the region of interest 510.

Referring back to FIG. 15, in step S440, the reclaim manage module 133 determines the first page to be reclaimed if the number of memory cells in the region of interest 510 is equal to or greater than the reference value and determines the first page not to be reclaimed if the number of memory cells in the region of interest 510 is smaller than the reference value.

Figure 19:
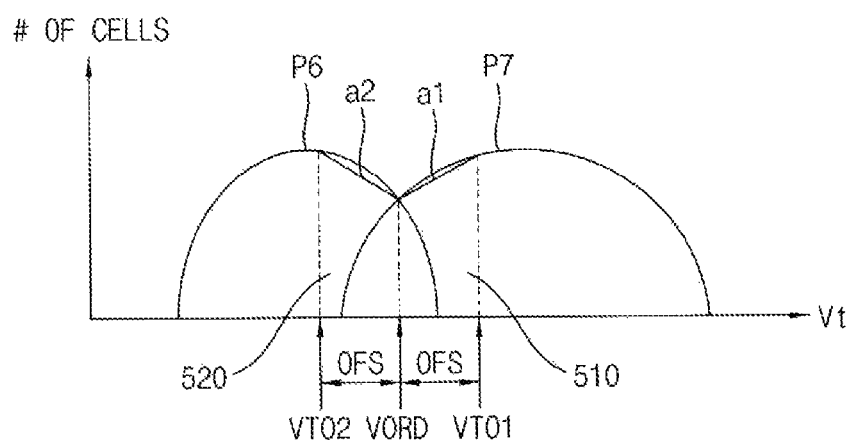

In example embodiments, the region of interest 510 may be a region defined by the optimal read voltage VORD and a second voltage VTO2 (as shown in FIG. 19) which is smaller than the optimal read voltage VORD by an offset voltage OFS.

In example embodiments, each of the first and second voltages VTO1 and VTO2 may be determined based on a result of a number of experimental tests.

Figure 18:
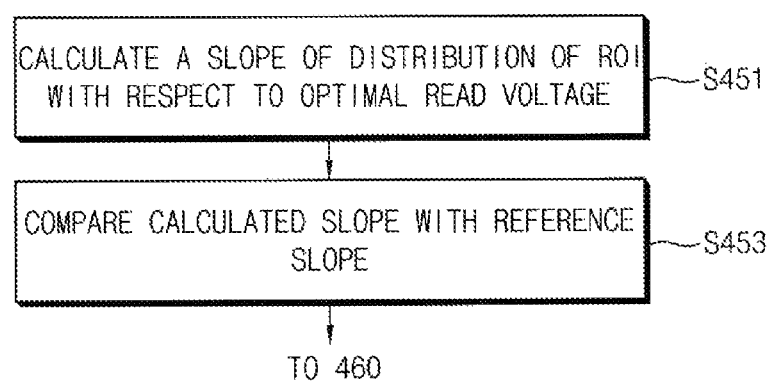
FIGS. 18, 19 and 20 are diagrams for explaining step S450 in FIG. 15 according to exemplary embodiments.
Figure 20:
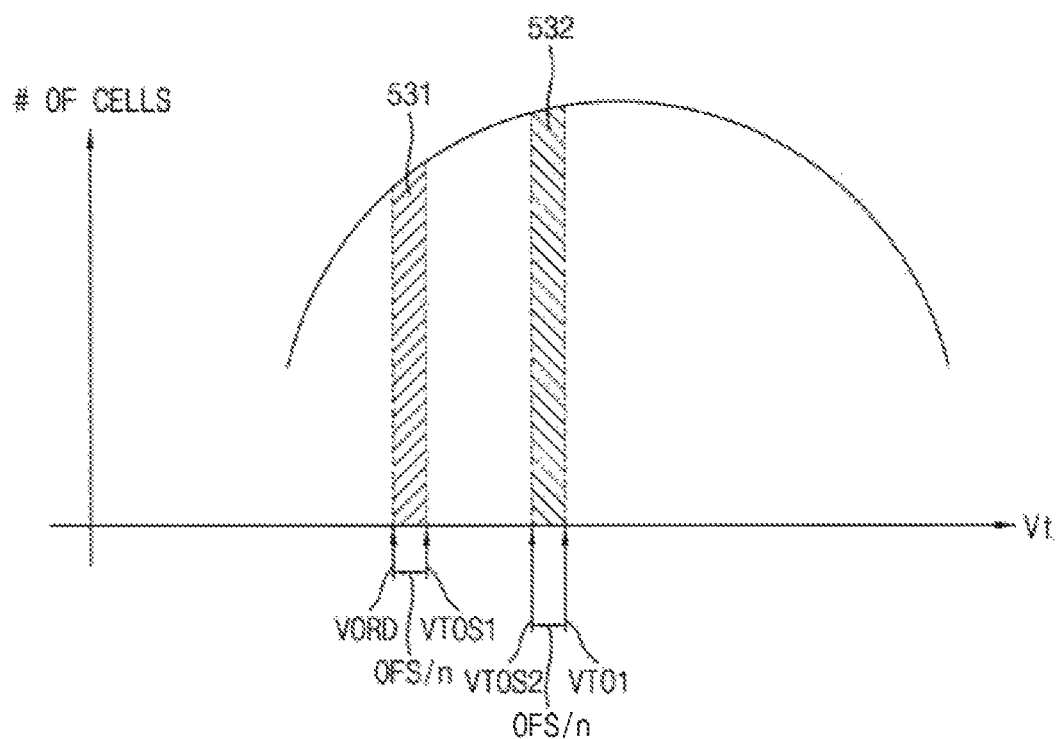

FIGS. 18, 19 and 20 are diagrams for explaining step S450 in FIG. 15 according to exemplary embodiments.

In FIGS. 19 and 20, for brevity of description, it is assumed that a valley value exits in overlapping regions of the sixth and seventh program states P6 and P7, and a region of interest 510 is a region defined by the optimal read voltage VORD and a first voltage VTO1 which is greater than the optimal read voltage VORD by an offset voltage OFS.

In example embodiments, a level of each first voltage VTO1 of FIGS. 17 and 19 may be the same as or different from each other. In this case, the offset voltage OFS of FIG. 17 is different from the offset voltage OFS of FIG. 19.

Referring to FIG. 18, step S450 includes steps S451 and S453.

In step S451, the reclaim manage module 133 may calculate a slope of a threshold voltage distribution of the memory cells in the region of interest 510 with respect to the optimal read voltage VORD.

In step S453, the reclaim manage module 133 compares the calculated slope a1 of the voltage distribution of the region of interest 510 with a reference slope. The reference slope may indicates a slope of the threshold voltage distribution of the region of interest 510 when the data of the first page include no errors and the reference slope may be pre-stored in the reclaim manage module 133.

Referring to FIG. 19, when a slope a1 of a threshold voltage distribution of the region of interest 510 is greater than the reference slope, the controller 100 may not perform the reclaim of the first page. Alternately, when the slope a1 of a threshold voltage distribution of the region of interest 510 is equal to or smaller than the reference slope, the controller 100 may perform the reclaim of the first page.

In example embodiments, the reclaim manage module 133 may further compare a calculated slope a2 of a voltage distribution of a region 520 with the reference slope. The region 520 may be defined by the optimal read voltage VORD and a second voltage VTO2 which is smaller than the optimal read voltage VORD.

In example embodiments, the memory controller 100 may perform the reclaim of the first page when at least one of the slope a1 and the slope a2 is equal to or smaller than the reference slope.

In FIG. 19, it is assumed that the slope a1 is equal to or smaller than the reference slope and the slope a2 is greater than the reference slope. In this case, a number of errors of data of the sixth program state P6 may be smaller than a number of errors of data of the seventh program state P7.

FIG. 20 is an enlarged diagram of the region of interest in FIG. 19 according to exemplary embodiments.

FIG. 20 is a diagram for explaining calculation of a slope of the threshold voltage distribution of the region of interest 510 in FIG. 19.

For calculating a slope a1 of the threshold voltage distribution of the region of interest 510, the reclaim manage module 133 divides a voltage range between the optimal read voltage VORD and the first voltage VTO1 which is greater than the optimal read voltage VORD by the offset voltage OFS into a plurality of sub sections. The reclaim manage module 133 counts a first number of memory cells in a first sub region 531 defined by the optimal read voltage VORD and a first section voltage VTOS1 which is greater than the optimal read voltage VORD by a sub offset voltage OFS/n. The reclaim manage module 133 counts a second number of memory cells in a second sub region 532 defined by the first voltage VTO1 and a second section voltage VTOS2 which is smaller than the first voltage VTO1 by the sub offset voltage OFS/n. The reclaim manage module 133 may calculate the slope a1 of the threshold voltage distribution of the region of interest 510 based on the optimal read voltage VORD, the first voltage VTO1, the first number of memory cells and the second number of memory cells.

The slope a1 of the threshold voltage distribution of the region of interest 510 may indicates a degradation degree of a program state corresponding to the region of interest 510. As the program state corresponding to the region of interest 510 is more degraded, the valley value increases more and the slope a1 of the threshold voltage distribution of the region of interest 510 decreases. Therefore, whether to perform reclaim of the first page may be determined by calculating the slope a1 of the threshold voltage distribution of the region of interest 510.

Referring back to FIG. 15, in step S460, the reclaim manage module 133 determines the first page to be reclaimed if the slope a1 of the threshold voltage distribution of the region of interest 510 is equal to or smaller than the reference slope and determines the first page not to be reclaimed if the slope a1 of the threshold voltage distribution of the region of interest 510 is greater than the reference slope.

Figure 21:
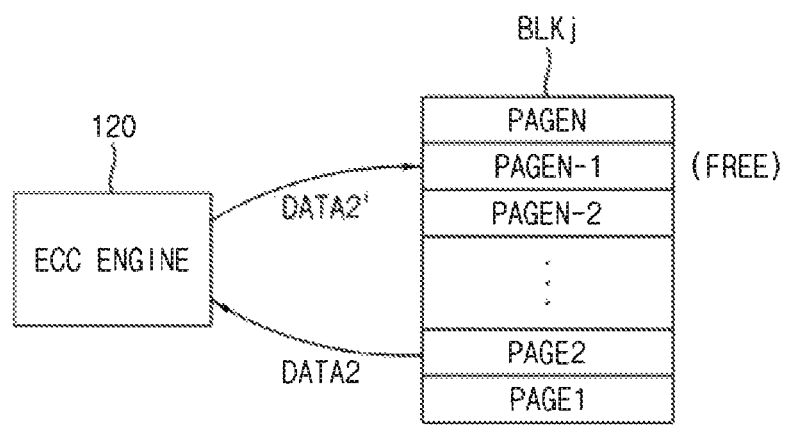
FIG. 21 illustrates a reclaim operation performed in the storage device of FIG. 2 according to exemplary embodiments.

FIG. 21 illustrates a reclaim operation performed in the storage device of FIG. 2 according to exemplary embodiments.

Referring to FIGS. 2, 3, 8B and 21, when the reclaim manage module 130 determines to reclaim data DATA2 of a page PAGE2 in the memory block BLKj, the ECC engine 120 corrects errors of the data DATA2 to provide the corrected data DATA2' to the nonvolatile memory device 200, and the nonvolatile memory device 200 perform a reclaim operation by programming the corrected data DATA2' in a free page PAGEN-1 in the memory block BLKj, which does not store data.

With above-mentioned exemplary embodiments, the method of controlling a reclaim of a nonvolatile memory device and the method of operating a storage device are described as performed on a page. However, the methods according to exemplary embodiments may be sequentially performed on a plurality of pages.

When the nonvolatile memory device 200 includes a three-dimensional memory cell array, the first memory block includes a first page of first memory cells coupled to a first word-line and a second page of second memory cells coupled to a second word-line. The second memory cells are stacked on the first memory cells. In this case, the optimal read voltage may vary for the first word-line and the second word-line. The valley search operation may be performed respectively for the first page and the second page.

As mentioned above, after the recovery read operation is performed on a page of data which includes uncorrectable errors using the optimal read voltage, it is determined whether to perform a reclaim of the page based on a threshold voltage distribution around the optimal read voltage, when the errors of the page are corrected. Therefore, a situation where the page is degraded into an uncorrectable page may be prevented. Accordingly, performance and data reliability of the storage device may be enhanced.

Figure 22:
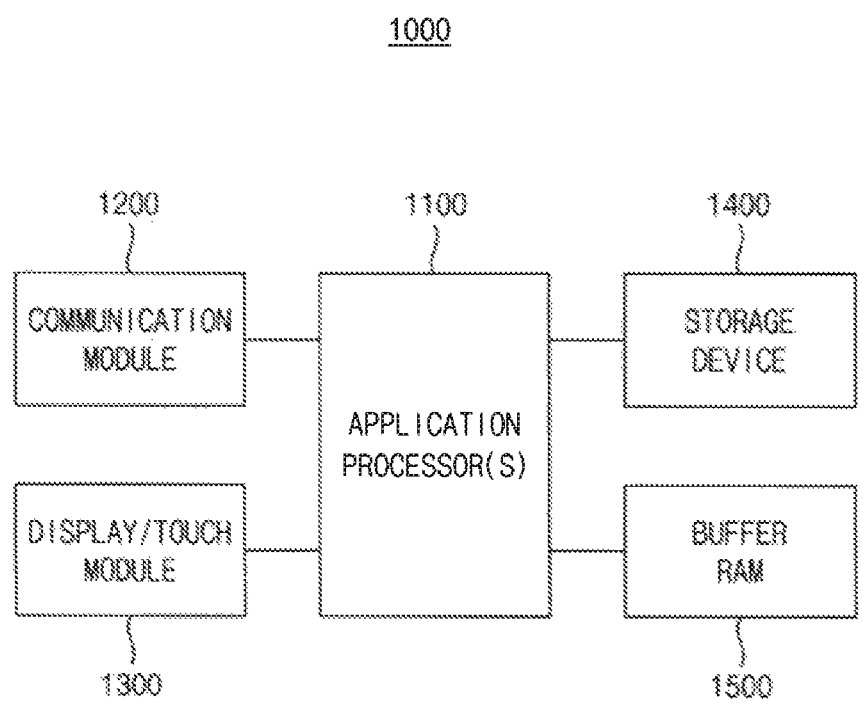
FIG. 22 is a block diagram illustrating a mobile device according to example embodiments.

FIG. 22 is a block diagram illustrating a mobile device according to example embodiments.

Referring to FIG. 22, a mobile device 1000 may include an application processor 1100, a communication module 1200, a display/touch module 1300, a storage device 1400, and a buffer RAM 1500.

The application processor 1100 controls operations of the mobile device 1000. The communication module 1200 is implemented to perform wireless or wire communications with an external device. The display/touch module 1300 is implemented to display data processed by the application processor 1100 or to receive data through a touch panel. The storage device 1400 is implemented to store user data. The storage device 1400 may be eMMC, SSD, UFS device, etc. The storage device 1400 may employ the storage device 30 of FIG. 2. The storage device 1400 may include a memory controller and at least one nonvolatile memory device. The memory controller performs a recovery read operation on a page of data which includes uncorrectable errors using the optimal read voltage VORD, and determines whether to perform a reclaim of the page based on a threshold voltage distribution around the optimal read voltage VORD, if the errors of the page are corrected. Therefore, the memory controller may prevent the page from being degraded into an uncorrectable page.

The buffer RAM 1500 temporarily stores data used for processing operations of the mobile device 1000.

A nonvolatile memory device or a storage device according to exemplary embodiments may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of controlling reclaim of a nonvolatile memory device including a plurality of memory blocks, wherein each of the memory blocks includes a plurality of pages, the method comprising:
   performing a recovery read operation on first data using an optimal read voltage determined based on the first data, when the first data includes errors which are not correctable using an error correction code (ECC) operation, wherein the first data is read from a first page of a first memory block of the memory blocks, the first page including a plurality of memory cells; and
   when the errors of the first data are corrected after the recovery read operation is performed, determining whether to perform a reclaim of the first page based on a threshold voltage distributions of a set of memory cells of the plurality of memory cells of the first page, wherein the threshold voltage distribution of the set of memory cells is within a threshold voltage region of interest adjacent to the optimal read voltage.

2. The method of claim 1, wherein the optimal read voltage represents a threshold voltage corresponding to a valley of overlapping regions of two program states of a plurality of program states of the plurality of memory cells of the first page,
   wherein the threshold voltage region of interest is a region defined by the optimal read voltage and a first voltage different from the optimal read voltage in at least one of the two program states, and
   wherein the first voltage has a difference from the optimal read voltage by an offset voltage.

3. The method of claim 2, wherein the determining whether to perform a reclaim of the first page comprises:
   counting a number of memory cells that have a threshold voltage within the threshold voltage region of interest, of the set of memory cells;
   first comparing the counted number of memory cells with a reference value; and
   determining selectively whether to reclaim the first page based on a result of the first comparing.

4. The method of claim 3, wherein it is determined that the first page should be reclaimed when the counted number of memory cells is equal to or greater than the reference value.

5. The method of claim 3, wherein it is determined that the first page should not be reclaimed when the counted number of memory cells is smaller than the reference value.

6. The method of claim 3, wherein the counting a number of memory cells within the threshold voltage region of interest comprises:
   counting a first number of memory cells of the set of memory cells, which are turned-on by applying the first voltage to the first page;
   counting a second number of memory cells of the set of memory cells, which are turned-on by applying the optimal read voltage to the first page; and
   calculating a difference between the first number and the second number.

7. The method of claim 3, wherein when it is determined that the first page should not be reclaimed based on the result of the first comparing, the method further comprises:
   calculating a slope of the threshold voltage distribution of the set of memory cells within the threshold voltage region of interest with respect to the optimal read voltage;
   second comparing the calculated slope with a reference slope; and
   determining selectively whether to reclaim the first page based on a result of the second comparing.

8. The method of claim 7, wherein it is determined that the first page should be reclaimed when the calculated slope is equal to or smaller than the reference slope.

9. The method of claim 7, wherein it is determined that the first page should not be reclaimed when the calculated slope is greater than the reference slope.

10. The method of claim 1, wherein when it is determined that the first page should be reclaimed, at least one error of the first page is corrected, and the corrected first page is programmed into a second page other than the first page, and wherein the second page is a free page.

11. The method of claim 1, wherein when overlapping regions of two program states of a plurality of program states of the plurality of memory cells of the first page includes a plurality of valley values, the optimal read voltage represents a threshold voltage of a valley value corresponding to a maximum value of numbers of memory cells represented by the valley values.

12. A method of operating a storage device comprising at least one nonvolatile memory device and a memory controller configured to control the at least one nonvolatile memory device, wherein the at least one nonvolatile memory device includes a plurality of memory blocks, and each of the memory blocks includes a plurality of pages, the method comprising:
   performing a default read operation on a first page of a first memory block of the memory blocks using a default read voltage set to generate first data, wherein the first page includes a plurality of memory cells;
   when the first data includes errors which are not correctable, determining an optimal read voltage based on the first data to perform a recovery read operation on the first data based on the optimal read voltage; and
   when the errors of the first data are corrected after the recovery read operation is performed, determining whether to perform a reclaim of the first page based on a threshold voltage distributions of a set of memory cells of the plurality of memory cells of the first page, wherein the threshold voltage distribution of the set of memory cells is within a threshold voltage region of interest adjacent to the optimal read voltage.

13. The method of claim 12, wherein the optimal read voltage represents a threshold voltage corresponding to a valley value of overlapping regions of two program states of a plurality of program states of the plurality of memory cells of the first page,
wherein the threshold voltage region of interest is a region defined by the optimal read voltage and a first voltage different from the optimal read voltage in at least one of the two program states, and
wherein the first voltage has a difference from the optimal read voltage by an offset voltage.

14. The method of claim 13, wherein the determining whether to perform a reclaim of the first page comprises:
counting a number of memory cells that have a threshold voltage within the threshold voltage region of interest, of the set of memory cells;
first comparing the counted number of memory cells with a reference value; and
determining selectively whether to reclaim the first page based on a result of the first comparing.

15. The method of claim 14, wherein when it is determined that the first page should not be reclaimed based on the result of the first comparing, the method further comprises:
calculating a slope of the threshold voltage distribution of the set of memory cells within the threshold voltage region of interest with respect to the optimal read voltage;
second comparing the calculated slope with a reference slope; and
determining selectively whether to reclaim the first page based on a result of the second comparing.

16. The method of claim 12, wherein when it is determined that the first page should be reclaimed, at least one error of the first page is corrected, and the corrected first page is programmed into a second page other than the first page, and
wherein the second page is a free page.

17. The method of claim 12, wherein the first memory block comprises:
first memory cells connected to a first word-line; and
second memory cells connected to a second word-line and stacked on the first memory cells,
wherein the optimal read voltage varies with respect to the first and second word-lines.

18. A method of controlling a nonvolatile memory device including a plurality of pages, each page including a plurality of memory cells having a plurality of program states, the method comprising:
performing a first read operation on first data read from a first page of the plurality of pages using a first voltage set;
performing a second read operation on the first data using a second voltage, when the first data includes errors which are not correctable by an error correction code (ECC) operation;
when the errors of the first data are correctable using the ECC operation by the second read operation, performing at least one of:
a) counting a number of memory cells of the first page that have a threshold voltage in a first threshold voltage region defined by the second voltage and a third voltage different from the second voltage, and
b) first calculating a slope of a threshold voltage distribution of memory cells in a second threshold voltage region with respect to the second voltage and a fourth voltage; and
selectively performing a reclaim of the first page based on the result of at least one of the performing a) and b),
wherein the second threshold voltage region is defined by the second voltage and the fourth voltage different from the second voltage.

19. The method of claim 18, wherein selectively performing the reclaim of the first page based on the result of at least one of the performing a) and b) includes:
performing the reclaim of the first page when the counted value is equal to or greater than a first reference value, and/or when the first calculated slope is equal to or smaller than a reference slope.

20. The method of claim 18, further comprising:
second calculating a slope of a threshold voltage distribution of memory cells in a third threshold voltage region with respect to the second voltage and a fifth voltage different from the second and fourth voltages; and
selectively performing the reclaim of the first page based on the second calculated slope value,
wherein the third threshold voltage region is disposed at an opposite side of the second threshold voltage region with respect to the second voltage and is defined by the second and fifth voltages.

* * * * *